(12) United States Patent
Abouda et al.

(10) Patent No.: US 8,384,313 B2
(45) Date of Patent: Feb. 26, 2013

(54) SYSTEM AND METHOD TO IMPROVE SWITCHING IN POWER SWITCHING APPLICATIONS

(75) Inventors: Kamel Abouda, Saint Lys (FR); Murielle Delage, Fonsorbes (FR); Erwan Hemon, Goyrans (FR); Pierre Turpin, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 324 days.

(21) Appl. No.: 12/742,103

(22) PCT Filed: Nov. 13, 2007

(86) PCT No.: PCT/IB2007/055386
§ 371 (c)(1),
(2), (4) Date: May 10, 2010

(87) PCT Pub. No.: WO2009/063274
PCT Pub. Date: May 22, 2009

(65) Prior Publication Data
US 2010/0244714 A1 Sep. 30, 2010

(51) Int. Cl.
*H05B 37/02* (2006.01)
(52) U.S. Cl. ........ 315/360; 327/108; 327/393; 327/399; 327/427
(58) Field of Classification Search .............. 315/209 R, 315/224, 360; 327/108, 109, 392, 393, 399, 327/419, 427; 307/139, 141; 702/85, 89
See application file for complete search history.

(56) References Cited

U.S. PATENT DOCUMENTS

| | | | |
|---|---|---|---|
| 6,330,194 B1 | 12/2001 | Thomann et al. | |
| 6,483,370 B1* | 11/2002 | Bienvenu et al. | 327/442 |
| 6,617,895 B2 | 9/2003 | Zumkehr et al. | |
| 6,727,733 B2* | 4/2004 | Klein | 327/108 |
| 6,903,597 B2* | 6/2005 | Tai | 327/434 |
| 7,133,790 B2 | 11/2006 | Liou | |
| 8,013,658 B2* | 9/2011 | Huang | 327/392 |
| 2002/0105356 A1 | 8/2002 | Genna et al. | |
| 2003/0201811 A1 | 10/2003 | Zumkehr et al. | |
| 2004/0257949 A1* | 12/2004 | Hsu et al. | 369/59.2 |

FOREIGN PATENT DOCUMENTS

WO 99/34510 A 7/1999

OTHER PUBLICATIONS

International Search Report and Written Opinion correlating to PCT/IB2007/055386 dated Aug. 14, 2008.

* cited by examiner

*Primary Examiner* — Thuy Vinh Tran (57) ABSTRACT

A circuit for improving the control of a change in state of a signal in an electronic device between a first state and a second state, wherein a first change in state occurs when the state changes from the second state to the first state and a second change in state occurs when the state changes from the first state to the second state and wherein the first and second changes in state have associated therewith a first and a second time delay over which each change in state occurs, characterized in that said circuit comprises a determining unit for measuring the first time delay and a calculator for calculating a common delay to replace one or more of the first and second delays to thereby improve the control of the change in state of the signal.

18 Claims, 7 Drawing Sheets

SYSTEM AND METHOD TO IMPROVE SWITCHING IN POWER SWITCHING APPLICATIONS

FIELD OF THE INVENTION

This invention relates to a product, system, method and computer program to improve switching in power switching applications and more particularly to manage time delays of power up and power down processes.

BACKGROUND OF THE INVENTION

Pulse width modulation (PWM) is a technology which modulates an electronic signal or a power source in order to transmit information to an electronic device or to control the amount of power sent to an electronic device. PWM occurs in many applications such as power lighting applications for example.

With PWM technology the amount of power sent to a light device such as a Light Emitting Diode (LED), through a switch such as a MOS power transistor or MOSFET (Metal Oxide Semiconductor Field Effect Transistor), can be controlled. The use of PWM technology with low duty cycles requires that the time delay for switching on the MOSFET and the corresponding time delay for switching off the MOSFET are nearly symmetrical. The aim is to ensure that the ON time of the input control signal of the MOSFET equals the ON time of the output voltage of the MOSFET. Thus, the MOSFET can run with low duty cycle. Therefore, the power of the LED is modulated and the lifetime of the LED is greatly enhanced. However, the MOSFET takes generally more time to switch off than to switch on. The unsymmetrical time delays for switching on and off the MOSFET come from the manufacturing process and dynamic characteristics of MOSFET technology.

Indeed the manufacturing process gives rise to mistakes caused by etching and metallization process for example. With these, there is no guarantee that each integrated circuit will have exactly same characteristics for each component thereon. This difference in behaviour of various components of the MOSFET leads further additional time delay between the switching off and switching on processes of a lighting device such as an LED.

US 2003/201811 discloses a method and device for symmetrical slew rate calibration. The aim of US2003/201811 is to directly measure slew rates for push pull driver devices in order to calibrate slew rates. The method uses a driver acting as an oscillator.

U.S. Pat. No. 7,133,790 discloses a method and system of calibrating a control delay time. The method uses a comparison step which uses a predefined pattern.

SUMMARY OF THE INVENTION

The present invention provides a product, system, method and computer program for controlling the time delay between a switch ON and two switch OFF signals as described in the accompanying claims.

BRIEF DESCRIPTION OF THE DRAWINGS

Reference will now be made, by way of example, to the accompanying drawings, in which.

DETAILED DESCRIPTION OF THE PREFERRED EMBODIMENTS

Figure 1:
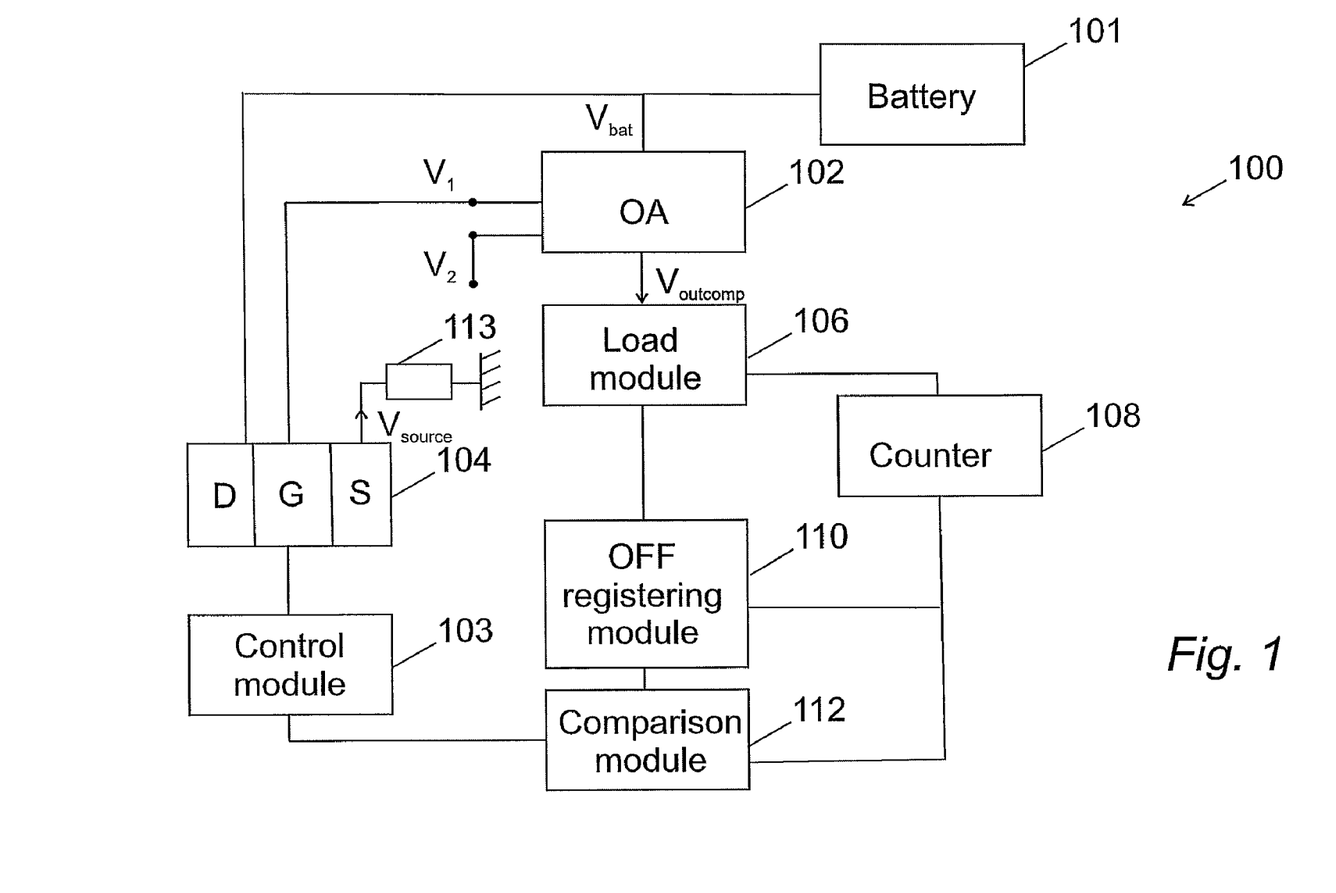
FIG. 1 is a representation of an electronic circuit in accordance with a first example of an embodiment of the invention, given by way of example.

Referring to FIG. 1 shows a representation of a circuit 100. The circuit 100 is a part of a LED driver circuit. The circuit 100 comprises a comparator 102, which in this example includes an operational amplifier (OA) which is used as a comparator. The OA has a power supply Vbat of a battery 101. Vbat generally equals 12 to 14 volts (V). A control module 103 controls the power switching of a MOSFET 104 (Metal Oxide Semiconductor Field Effect Transistor) 104 through an input control ON signal i.e. an ON instruction for the switching ON state of the MOSFET 104 and an input control OFF signal i.e. an OFF instruction for the switching OFF state of the MOSFET 104. Vsource is the source voltage of the MOSFET 104. MOSFET 104 comprises a drain D, a gate G and a source S. Vsource can be a switching OFF signal, a switching ON signal or a running state signal as will be defined below. When the control module 103 has an ON instruction, the MOSFET 104 is about to be switched ON and consequently the LED (not shown) will be switched ON. When the control module 103 has an OFF instruction, the MOSFET 104 is about to be switched OFF and consequently the LED (not shown) will be switched OFF. The comparator 102 has a non-inverting input voltage V1 called Vgate. Vgate refers to the voltage of the gate of the MOSFET 104, relative to the ground. Vgate varies depending from the change in state ON or OFF of the MOSFET 104. When the MOSFET 104 is switched ON, Vgate increases from 0V to Vbat+12V and when the MOSFET 104 is switched OFF, Vgate increases from Vbat+12V to 0V. The value of 12V is just an example and may be different according to the voltage required for the gate, between 10 and 12 V for example. A second inverting input voltage V2 equals to Vbat+3V.

This value of V2 is a threshold value defined experimentally as described below. The value of 3V is just an example. The value of 3V depends on the technical characteristic of the electronic components of the MOSFET 104. Therefore, the value of 3V may be different according to the MOSFET 104 used for determining the threshold value V2. Voutcomp is the output voltage of the OA. Voutcomp results from a comparison between V1 and V2 as the OA is used as a comparator 102 as mentioned above. Voutcomp is so defined that Voutcomp is at a high level when V1 is lower than V2 and the reference voltage of the OA is V2. In the first present embodiment the gate of the MOSFET 104 is used as V1 and the drain D of the MOSFET 104 is used as Vbat. The source of the MOSFET is directly connected to a load 113. The load 113 is directly connected to the ground. Indeed, it appears after several tests on specific power switches that the change of the voltage value of Vgate from the maximum value of Vbat+12V to the value of V2 indicates that the MOSFET 104 is being switched off. When Vgate decreases to V2, the time of the decreasing refers to a time Tdetoff, which will be used to define the symmetry between TdelayON and TdelayOFF as described below. Thus, the MOSFET 104 is defined with three states, which are a switching ON state, a switching OFF state and a running state. The signal of Vsource can represent either a switching OFF signal, a switching ON signal or a running signal. The switching ON and OFF states respectively define a switch ON delay which is TdelayON and a switch OFF delay which is TdelayOFF.

Figure 2:
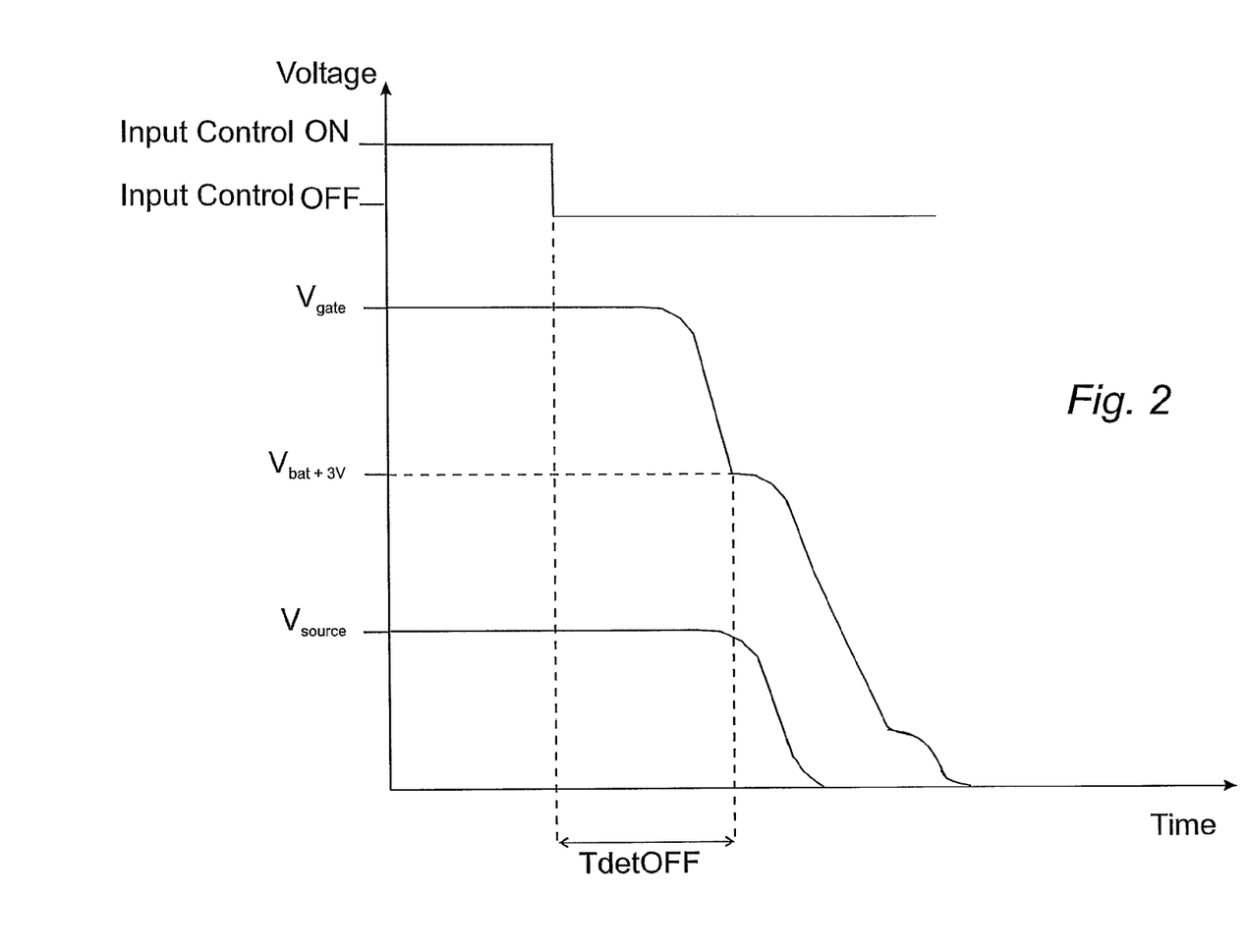
FIG. 2 is a graph of electronic signals versus time in accordance with an embodiment of the invention, given by way of example.
Figure 3:
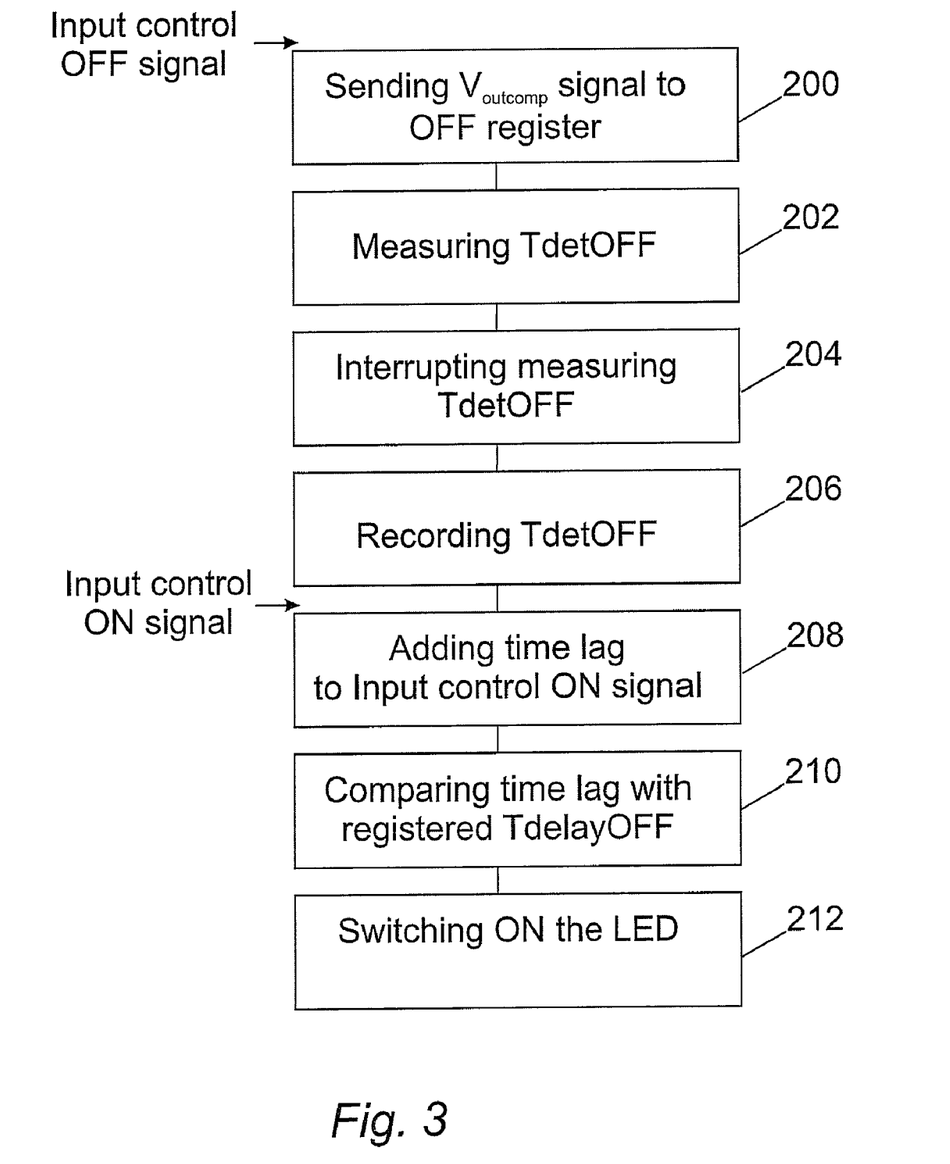
FIG. 3 is a flow chart of a first example of a method in accordance with the invention, given by way of example.

The circuit 100 also comprises different modules, which are connected to the comparator 102. The modules are a load module 106, a counter 108, an OFF registering module 110 and a comparison module 112. Thus, the comparator 102 is communicatively connected to the load module 106. The load module 106 is connected to the OFF registering module 110. The load module 106 is also connected to the counter 108. The counter 108 connects both the OFF registering module and the comparison module 112. The OFF registering module 110 is connected to the comparison module 112. The comparison module 112 is connected to the control module 103 which connects the MOFSET 104. The MOSFET 104 is directly connected to the comparator 102. The counter 108 and the OFF registering module 110 represent determining unit. The comparator 102 represents a calculator. The load module 106 monitors the signal Voutcomp to send the content of the counter 108 to an ON register 302 and/or an OFF register 110 as shown in FIG. 3. The counter 108 measures the time during which the signal Voutcomp from the comparator 102 is high, starting from the control module 103 sending an OFF instruction. This unit that the counter 108 only measures the time delays TdelayON, TdelayOFF when Vgate is higher than V2. The OFF registering module 110 specifically registers the time values of TdetOFF for switching OFF signals during several switching OFF states. FIG. 2 shows an example of a TdetOFF measured during a switching OFF state signal occurring when the control module 103 has an OFF instruction. TdetOFF results from the measured time for Vgate to decrease from a high level i.e. Vgate to a low level i.e. V2. As the comparison module 112 is connected to the counter 108, the comparison module 112 monitors the time lag being added to a switching ON state signal. As the comparison module 112 is also connected to the OFF registering module 110, the comparison module 112 compares the time lag being added to the switching ON state signal with the registered TdetOFF in the OFF registering module 110. The comparison process occurs in order to add to the switching ON state signal a time lag. The time lag added to the switching ON state signal is the same as the registered value in the OFF registering module 110.

The circuit 100 shown in FIG. 1 may execute an example of a method for controlling a change in state of a signal. The method will now be described with reference to the steps as shown in FIG. 3. The process begins with the control module 103 having an OFF instruction. This unit that the MOSFET 104 is about to be switched OFF and that Vsource corresponds to a switching OFF state signal. Then Vgate decreases from Vbat+12V to 0V. In a step 200, the counter 108 starts to increment while the load module monitors the falling edge of the signal Voutcomp. In a step 202, the counter 108 begins to measure a specific time called the Tdetoff relating to Voutcomp. Tdetoff represents the useful time for the MOSFET 104 to go from saturation to a linear response.

In the saturation state, the MOSFET 104 is driven as a switch (a very low drain to source on resistance rds on with the gate 12 V higher than the source, that is the gate source voltage Vgs=12V. This Vgs value could be different depending from the power switches concerned by the method. The Vgs value may vary from 10 to 12 V for example. In the linear state, the MOSFET 104 is driven as a resistance. From the saturation to linear states the Voutcomp signal is high. In a step 204, as soon as Vgate reaches the defined value Vbat+3V, the counter 108 stops measuring time and Vsource continues to decrease to 0. Thus, in a step 206, the registering module 106 records the specific measured value of Tdetoff. Then the process follows with an ON instruction from the control module 103. This unit that the MOSFET 104 is about to be switched ON, and that Vsource corresponds to a switching ON state signal having a TdelayON to switch ON the MOSFET 104. In a step 208 the counter 108 begins to run in order to add a time lag to the input control ON signal before switching ON the MOSFET 104. The time lag refers to the Tdetoff already registered in step 206. The time lag is a voluntary digital added delay and does not result from dynamic characteristics of electronic components which also may produce a time lag. Therefore, before switching ON the MOSFET 104, the consign "input control ON" is delayed during a time, which equals Tdetoff as mentioned above. During the process of adding the time lag to TdelayON, in step 210, the comparison module 112 regularly checks that the added time lag does not exceed the value of Tdetoff registered in the registering module 106. As soon as the time lag equals Tdetoff registered in the previous switching OFF state, the comparison module 112 allows the MOSFET 104 to be switched ON in a step 212. Thus, Vgate increases from 0 to Vbat+12V. Then following the process, the control module 103 has an OFF instruction. Thus, the MOSFET 104 is about to be switched OFF and Vsource now refers to a switching OFF state signal. In the present embodiment, no time lag is added to the switching OFF state signal, therefore the LED (not shown) is being switched OFF without any additional time lag. The counter 108 runs in order to measures a new Tdetoff relating to the time it takes for the MOSFET 104 to be switched OFF. As previously mentioned, as soon as Vgate reaches the value of Vbat+3V, when decreasing to 0, the counter 108 stops measuring Tdetoff. Then the new value of Tdetoff is registered in the registering module 106. When the control module 103 has an ON instruction, Vsource refers to a switching ON state signal. Then, the counter 108 begins to run in order to add a time lag to the consign "input control ON". The comparison module 112 checks that the time lag reaches exactly the new value of Tdetoff registered in the registering module. As soon as the time lag reaches the new value of Tdetoff, the counter 108 stops and the comparison module 112 allows the Power MOSFET 104 to be switched ON. The process may repeat the above-mentioned steps as required by switching the MOSFET 104 off and on.

In the present embodiment of the invention, the time delay between the point in time the input control OFF signal is provided and the MOSFET 104 is really switched OFF is not adjusted and the time delay between the point in time the input control ON signal is provide and the MOSFET 104 is really switched ON is adjusted with a defined time lag. The time lag of a current switch ON signal is based on Tdetoff previous switch OFF signal. Therefore, the total current time delay of a current switch ON signal equals the current time delay of the switch ON signal plus the previous Tdetoff delay of the switch OFF signal, which unit that the corrected TdelayON is the sum of the TdelayON and Tdetoff. Thus, if the TdelayON equals to 10 µs and Tdetoff equals to 20 µs, the addition of the time lag, 20 µs, provides a corrected value of TdelayON, which equals 30 μs. As the process repeats, the next value of the corrected TdelayON follows the variations of Tdetoff.

Figure 4:
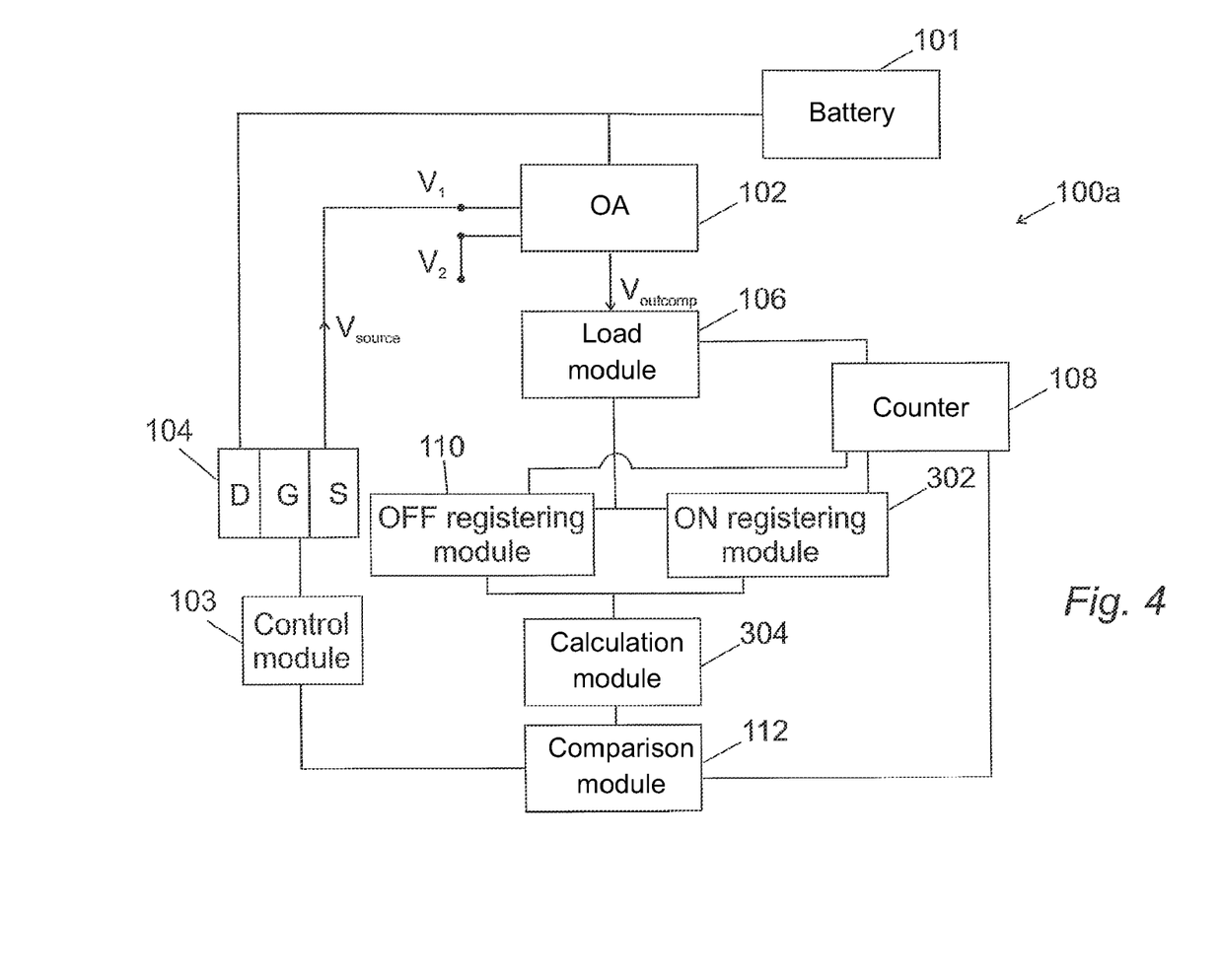
FIG. 4 is a representation of an electronic circuit in accordance with a second example of an embodiment of the invention, given by way of example.

FIG. 4 shows a second embodiment of the invention with a circuit 100a. In FIGS. 1 and 4, the same reference signs indicate like elements, and for sake of brevity those elements are not described again. As shown in FIG. 4, in addition to the elements of FIG. 1, FIG. 4 shows an additional ON registering module 302 and a calculation module 304. The ON registering module 302, as the OFF registering module 110, represents a determining unit in addition to the above cited determining unit and the calculation module 304 represents a calculator in addition to the above cited calculator. The ON registering module 302 registers the value of TdelayON of the switching ON state signal. Therefore, both TdelayON and TdelayOFF are registered in their corresponding ON and OFF registering modules 110. The ON registering module 302 and the OFF registering module 110 may also be gathered in a same module with different parts. The calculation module 304 calculates the subtraction between TdelayON and TdelayOFF. The result of the subtraction is a corrected time lag. The calculation module 304 further indicates which one of the time delays TdelayON and TdelayOFF has the largest value. The calculation module 304 and the counter 108 both connect OFF registering module 110 and ON registering module 302 and also connect in addition comparison module 112. The OFF registering module 110 and the ON registering module 302 are connected with the calculation module 304. The calculation module 304 is connected to the comparison module 112.

Figure 5:
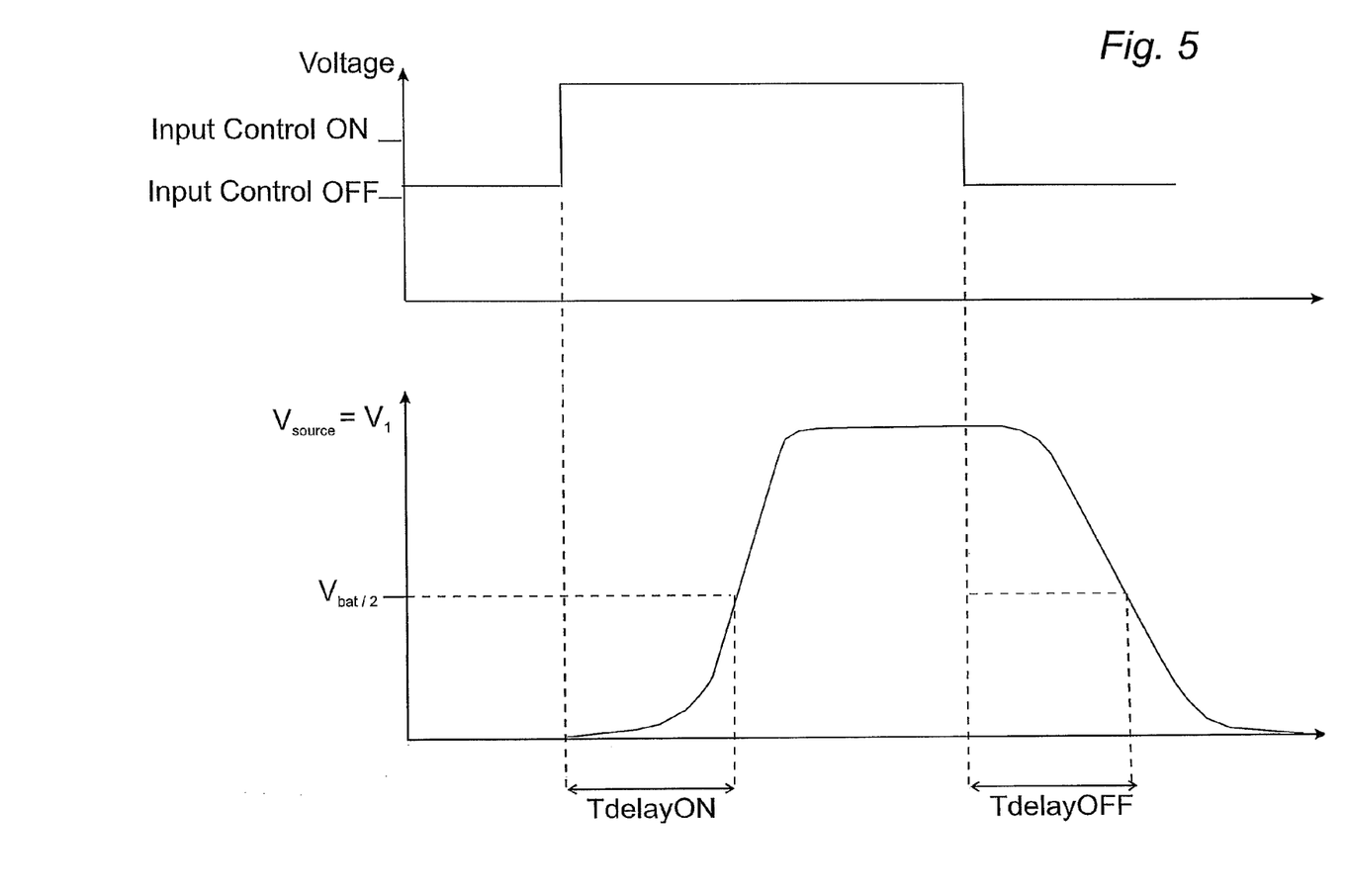
FIG. 5 is a graph of electronic signals versus time in accordance with an embodiment of the invention, given by way of example

The calculation module 304 outputs the result of the subtraction and the indication to the comparison module 112. With the output of the calculation module 304, the comparison module 112 is able to determine which one of the time delays TdelayON and TdelayOFF is the greatest and consequently which signal has to be delayed to optimise operation. Differing from the first embodiment as shown in FIG. 5, the threshold value for the change of switch ON and switch OFF state for the second embodiment is Vbat/2 while V1 equals the source voltage of Power MOSFET 104 (i.e. Vsource). In order to measure a time, for an electronic device, for switching OFF or for switching ON, the switch ON or switch OFF signal is measured at 50% of the total amplitude of the switch ON or switch OFF signal. Thus, as the total amplitude in the present embodiment is Vbat, therefore the time for switching ON or switching OFF is 50% of Vbat i.e. Vbat/2. The advantage of such a threshold value Vbat/2 is that Vbat/2 varies according to the change of the battery. In fact, when the control module 103 has an OFF instruction, meaning the MOSFET 104 is about to be switched OFF such that when the source voltage Vsource reaches the threshold value Vbat/2, the MOSFET 104 is considered as being switched OFF which unit that the MOSFET 104 is not already switched OFF. FIG. 5 shows an example of a TdelayOFF and a TdelayON measured during a switching OFF and a switching ON state signal respectively when the control module 103 has an OFF instruction and an ON instruction.

Figure 6:
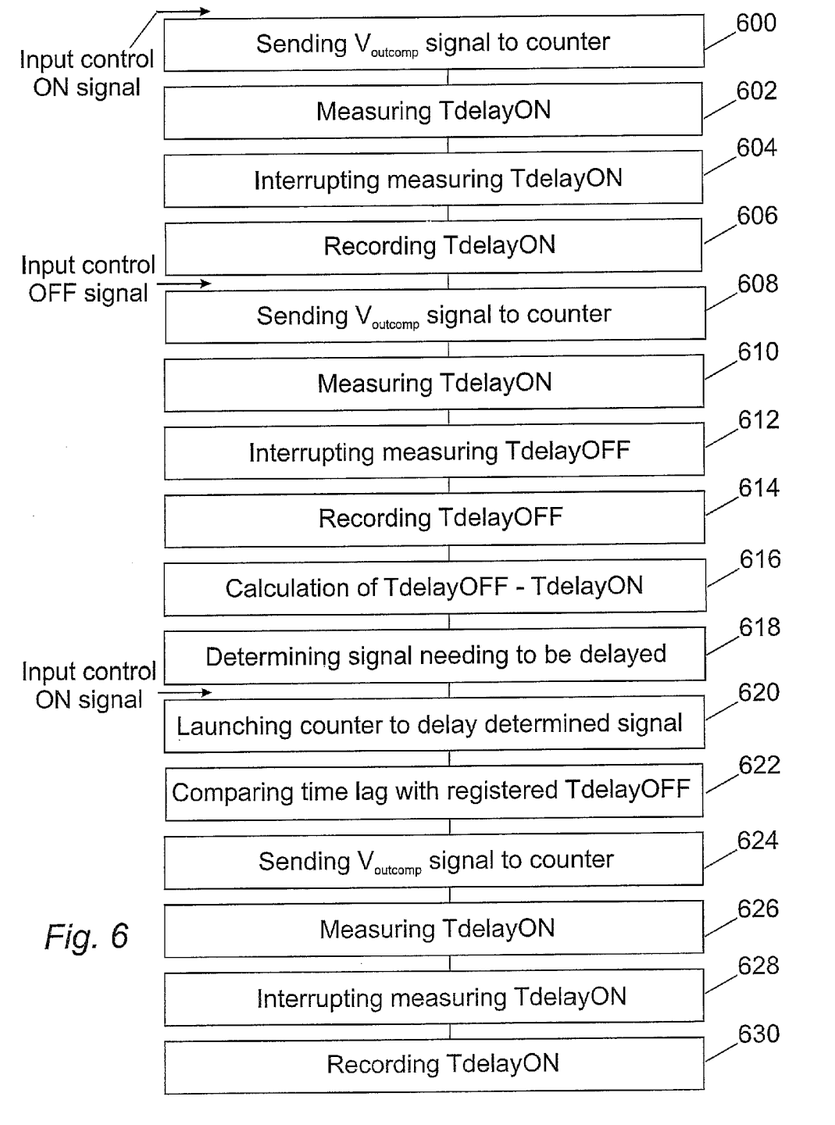
FIG. 6 is a flow chart of a second example of a method in accordance with the invention, given by way of example.

The circuit 100 shown in FIG. 4 may execute an example of a method for controlling a change in state of a signal, as will now be described with reference to the steps shown in FIG. 6. In this second embodiment, the source is used as V1 and the drain is connected to the ground. The process begins with the control module 103 having an ON instruction. This unit that the MOSFET is about to be switched ON and that Vsource refers to a switch ON state signal. Then Vgate increases from 0 to Vbat+12V. In a step 602, the load module 106 sends the content of the counter to the ON register on the rising edge of Voutcomp. In a step 604, the counter 108 begins to measure TdelayON, which corresponds to the time value for Vsource to reach Vbat/2. As the process of the circuit may generate some modifications in the characteristics of the components, a default value is added to the consign "input control ON" at the beginning of the process. This default value can be for example 4 μs. Thus, the counter 108 begins by measuring the default value. Then the counter 108 additionally measures TdelayON; Tdelay ON can be for example 15 μs. As soon as Vsource reaches Vbat/2, the value of total TdelayON which equals the default value plus TdelayON, i.e. 19 μs, is registered in the ON registering module 302 and the counter 108 stops measuring TdelayON as in step 604. Thus, during this ON instruction period, the total TdelayON has a value of 19 μs, which is the addition of the default value and TdelayON. Then, the control module 103 has an OFF instruction. This unit that Voutcomp now refers to a switch OFF state signal. In a step 608, the load module sends the content of the counter 108 to the OFF register on the falling edge of Voutcomp. In a step 610, the counter 108 measures TdelayOFF, which corresponds to the time for Vsource to go from Vbat/2 to 0V. As soon as Vsource reaches Vbat/2, the counter 108 stops measuring TdelayOFF in a step 612 and the value of TdelayOFF, for example 20 μs, is registered in the OFF registering module 110 in a step 614. Thus, during this OFF instruction period, TdelayOFF has a value of 20 μs. Then, in a step 616, the calculation module 304 is able to calculate the difference between TdelayON and TdelayOFF, i.e. 19−20=−1 μs. Thus, the calculation module 304 gives the value of the time lag, i.e. 1 μs between the switch OFF state signal and the switch ON state signal and, with the sign (i.e. positive or negative) of the result, the calculation module 304 determines which time delay is the highest, i.e. TdelayOFF. Thus, in step 618, the comparator can determine which signal needs to be delayed with the time lag indicated in the calculation module 304. Then the control module 103 has an ON instruction. Thus, Vgate will go from 0 to Vbat+12V. Before switching ON the MOSFET 104, in a step 620 the comparator launches the counter 108 in order to delay the switching ON signal with the value of the time lag indicated in the calculation module 304. Thus, the switching ON state is not set until the time lag indicated in the OFF registering module 110 has finished. In a step 622, the comparison module 112 has to check the counter 108 in order to stop the counter 108 when it reaches the value of the time lag. As soon as the counter 108 reaches the value of the time lag, the comparison module 112 allows the switch ON state and the counter 108 continues to measure the TdelayON in a step 626. As soon as Vsource reaches Vbat/2, the counter 108 stops measuring TdelayON in a step 628 and registers the value of TdelayON in the ON registering module 302 in a step 630. Therefore, the counter 108 registers time lag plus TdelayON, i.e. 1 μs+19 μs. Thus, the total TdelayON during this ON instruction is 20 μs. Therefore, TdelayON has the same value as TdelayOFF above-mentioned, which is 20 μs.

In the present embodiment of the invention, it is preferred that the time delay to switch OFF substantially equals the time delay to switch ON. The time lag of the delayed switch signal corresponds to the maximum value between TdelayON and TdelayOFF. The chosen example has a predetermined TdelayOFF higher than TdelayON. Thus, TdelayON is delayed to come to a corrected TdelayON, which equals TdelayOFF.

In the situation where TdelayON is higher than TdelayOFF, the delaying process delays TdelayOFF in order to provide a corrected TdelayON, which equals the value of TdelayON.

Figure 7:
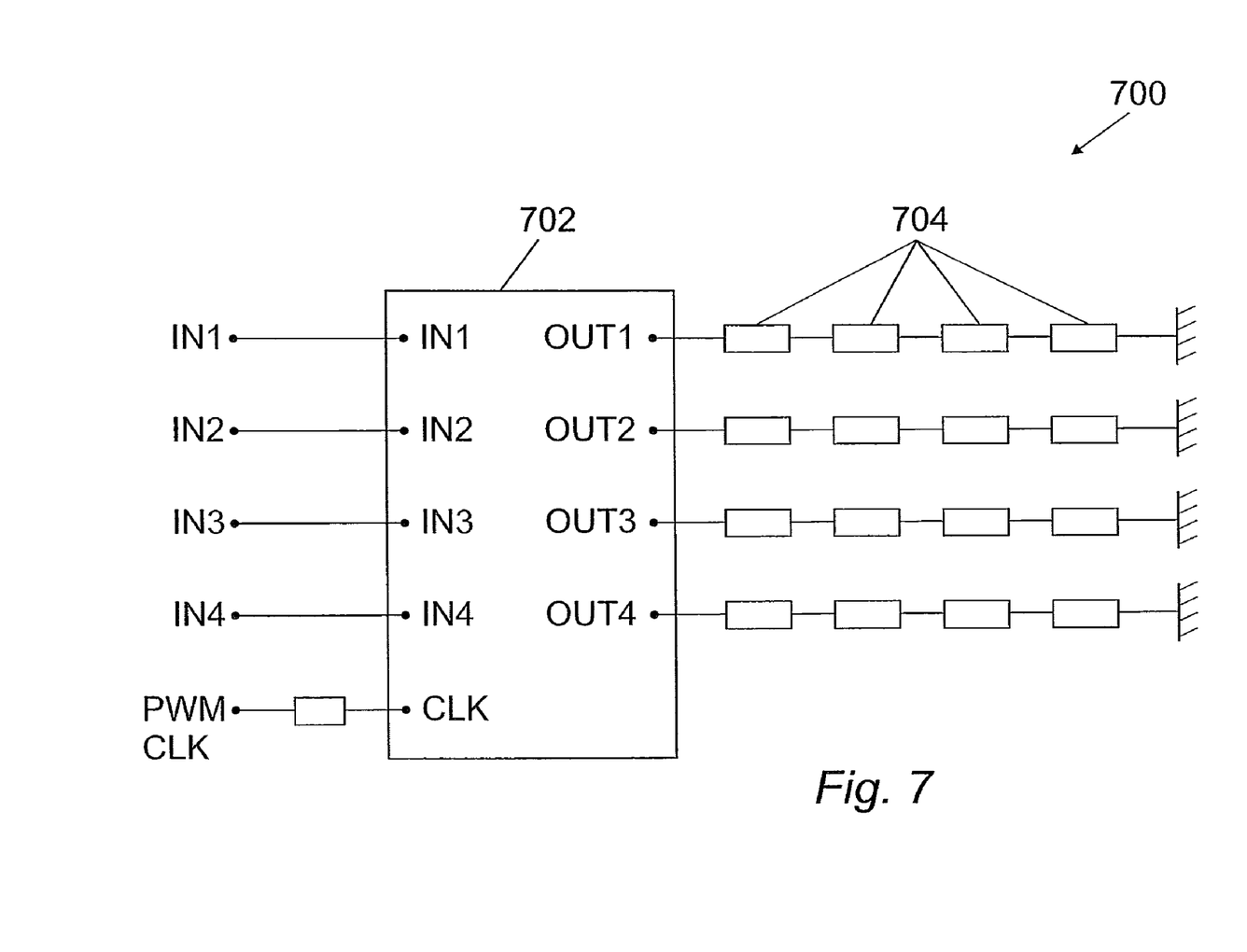
FIG. 7 is a representation of a lighting circuit in accordance with an embodiment of the invention, given by way of example.

FIG. 7 shows a global diagram 700 of a lighting circuit in a car for example. The diagram includes a device 702 in accordance with the present invention. The diagram represents four parallel connections comprising circuit inputs IN1, IN2, IN3 and IN4. Thus, in the diagram 700, the device 702 drives the output of four MOSFET 104 as will be described below. Each circuit input IN1, IN2, IN3 and IN4 relates to a specific lighting application in the car such as brake lights, indicator lights, etc. The circuit may comprise more or less than four circuit inputs. Different control signals (not shown) control the activation of each circuit input such as for example, the turn of a key when starting the engine. Each circuit input has a defined corresponding input IN1, IN2, IN3 and IN4 in the device 702. Inputs IN1, IN2, IN3 and IN4 still refer to a specific lighting application in the car as mentioned above. Inputs IN1, IN2, IN3 and IN4 refer to different signals which are sent to the gate of the MOSFET 104 of the device 702 after a signal process (not shown). Inputs IN1, IN2, IN3 and IN4 also have corresponding outputs OUT1, OUT2, OUT3 and OUT4 which refer to Vsource as defined in the description. Outside the device 702, each output signal enters an LED 704, which is serially connected to one output on each line. FIG. 7 shows three LEDs 704 per line as an example. Each connection may have one or more LEDs 704 and each connection may have a different number of LEDs than another connection. Additionally, the diagram 700 shows a pulse width modulation clock PWM CLK connected to the device 702. The PWM CLK gives the frequency of the signal in order to determine the PWM sampling frequency for the entering signals of the device 702.

The present invention allows the MOSFET 104 to work in many kinds of duty cycles which unit that the MOSFET 104 can work for any kind of ratio of run time to total cycle of time. More specifically for the disclosed embodiments, the MOSFET 104 works efficiently in a high duty cycle such as between about 95% and 100% and also in low duty cycle such as between about 0% and 5%.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be a type of connection suitable to transfer signals from or to the respective nodes, units or devices, for example via intermediate devices. Accordingly, unless implied or stated otherwise the connections may for example be direct connections or indirect connections.

It will be appreciated that the examples described above relate to lighting applications. Other alternatives may exist for MOSFETS 104 used for any other applications such as motor applications for example, which fall within the scope of the present invention.

Also, for example, the invention may be used for soft start on a motor control for a window and the like.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatus, while functionally operating as a single device.

For example, the invention may be used for domestic applications such as motorized shutters and the like.

Also, devices functionally forming separate devices may be integrated in a single physical device. For example, the circuit of the invention may be associated within a micro controller.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word "comprising" does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

The invention claimed is:

1. A PWM circuit for controlling a change in state of a signal applied to a power transistor in an electronic device between a first OFF state and a second ON state, wherein a first change in state occurs when the state changes from the second ON state to the first OFF state and a second change in state occurs when the state changes from the first OFF state to the second ON state and wherein the first change in state has associated therewith a first time delay over which the first change in state occurs, the circuit comprises:
a control unit for applying an instruction to the electronic device for triggering the change in state;
a determining unit for measuring the first time delay; and
a calculation module for calculating a time lag based on the first time delay and delaying the triggering of the second change in state by the time lag.

2. A circuit as claimed in claim 1, wherein the calculation module compares a characteristic voltage of the electronic device and a predetermined threshold value to determine the first time delay.

3. A circuit as claimed in claim 2 wherein the second change in state has associated therewith a second time delay over which the second change in state occurs, and the determining unit further measures the second time delay; and the calculation module for calculating the time lag based on a difference between the first time delay and the second time delay and determining either the first or the second time delay as a shortest time delay and delaying the triggering of the second change in state by the time lag when the first time delay is the shortest delay and delaying the triggering of the first change in state by the time lag when the second time delay is the shortest delay.

4. A circuit as claimed in claim 1 wherein the second change in state has associated therewith a second time delay over which the second change in state occurs, and the determining unit further measures the second time delay; and the calculation module for calculating the time lag based on a difference between the first time delay and the second time delay and determining either the first or the second change in state by the time lag when the first time delay is the shortest delay and delaying the triggering of the first change in state by the time lag when the second time delay is the shortest delay.

5. A circuit as claimed in claim 1, wherein the first change in state comprises a saturation phase and the first time delay corresponds to a duration of the saturation phase.

6. A circuit as claimed in claim 5, wherein the determining unit measures the first time delay when the electronic device is switched ON.

7. A circuit as claimed in claim 1, wherein the determining unit measures the first time delay when the electronic device is switched OFF.

8. A circuit as claimed in claim 1, wherein the circuit operates in a high duty cycle between about 95% and 100%.

9. A circuit as claimed in claim 1, wherein the circuit operates in a low duty cycle between about 0% and 5%.

10. A system comprising the circuit according to claim 1, wherein the electronic device comprises an LED lighting device.

11. A circuit as claimed in claim 1 wherein the circuit operates in a low duty cycle between about 0% and 5%.

12. A method for controlling a change in state of a signal in an electronic device between a first OFF state and a second ON state, wherein a first change in state occurs when the state changes from the second ON state to the first OFF state and a second change in state occurs when the state changes from the first OFF state to the second ON state and wherein the first change in state has associated therewith a first time delay over which the first change in state occurs, said method comprising:
   determining the first time delay associated with the first change in state;
   calculating a time lag based on the first time delay; and
   delaying a triggering of the second change in state by the time lag.

13. A method as claimed in claim 12, further comprising
   determining a second time delay associated with the second change in state;
   calculating the time lag based on a difference between the first time delay and the second time delay and determining either the first or the second time delay as a shortest delay;
   delaying the triggering of the second change in state by the time lag when the first time delay is the shortest delay and delaying the triggering of the first change in state by the time lag when the second time delay is the shortest delay.

14. A method as claimed in claim 13, further comprising running the electronic device in a high duty cycle between about 95% and 100%.

15. A method as claimed in claim 13, further comprising running the electronic device in a low duty cycle between about 0% and 5%.

16. A method as claimed in claim 12, further comprising running the electronic device in a high duty cycle between about 95% and 100%.

17. A method as claimed in claim 12, further comprising running the electronic device in a low duty cycle between about 0% and 5%.

18. A non-transitory computer readable medium including a computer program comprising instructions to carry out a control of a change in state of a signal in an electronic device between a first OFF state and a second ON state, wherein a first change in state occurs when the state changes from the second ON state to the first OFF state and a second change in state occurs when the state changes from the first OFF state to the second ON state and wherein the first change in state has associated therewith a first time delay over which the first change in state occurs, said instructions comprise:
   determining the first time delay associated with the first change in state;
   calculating a time lag based on the first time delay and
   delaying a triggering of the second change in state by the time lag.

* * * * *